(12) United States Patent
Teranishi et al.

(10) Patent No.: US 11,406,043 B2
(45) Date of Patent: Aug. 2, 2022

(54) ELECTRONIC CONTROL DEVICE HAVING A HEAT RADIATION STRUCTURE

(71) Applicant: Hitachi Automotive Systems, Ltd., Hitachinaka (JP)

(72) Inventors: Minami Teranishi, Tokyo (JP); Shinya Kawakita, Tokyo (JP); Hideyuki Sakamoto, Hitachinaka (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 0 days.

(21) Appl. No.: 17/267,578

(22) PCT Filed: Jun. 27, 2019

(86) PCT No.: PCT/JP2019/025601
§ 371 (c)(1),
(2) Date: Feb. 10, 2021

(87) PCT Pub. No.: WO2020/059240
PCT Pub. Date: Mar. 26, 2020

(65) Prior Publication Data
US 2021/0321539 A1    Oct. 14, 2021

(30) Foreign Application Priority Data

Sep. 20, 2018 (JP) .............................. JP2018-176227

(51) Int. Cl.
*H05K 7/20* (2006.01)
*H01L 23/367* (2006.01)

(52) U.S. Cl.
CPC ..... *H05K 7/20409* (2013.01); *H01L 23/3672* (2013.01); *H05K 7/20854* (2013.01)

(58) Field of Classification Search
CPC .......... H05K 7/20845–20854; H05K 7/20436; H05K 7/20454; H05K 7/20472–20481; H05K 7/20409; H01L 23/3672
See application file for complete search history.

(56) References Cited

U.S. PATENT DOCUMENTS

| 5,923,084 | A | | 7/1999 | Inoue et al. |
| 5,930,113 | A | * | 7/1999 | McCann ............ H05K 7/20409 361/688 |

(Continued)

FOREIGN PATENT DOCUMENTS

| JP | 9-55459 A | 2/1997 |
| JP | 2005-197303 A | 7/2005 |

(Continued)

OTHER PUBLICATIONS

International Search Report (PCT/ISA/210) issued in PCT Application No. PCT/JP2019/025601 dated Sep. 24, 2019 with English translation (four (4) pages).

(Continued)

*Primary Examiner* — Zachary Pape
(74) *Attorney, Agent, or Firm* — Crowell & Moring LLP

(57) ABSTRACT

Provided is an electronic control device including a first electronic component having a first heat generation amount, a second electronic component having a second heat generation amount smaller than the first heat generation amount, a substrate on which the first and second electronic components are mounted, and a housing that accommodates the first electronic component, the second electronic component and the substrate, and includes a case for heat radiation having a heat radiation structure through which heat of the first and second electronic components is radiated. The heat radiation structure includes a heat radiation block that is heat-bonded to the first electronic component, and a plurality of plate-shaped heat radiation fins extending outward from an outer peripheral portion of the heat radiation block.

10 Claims, 9 Drawing Sheets

(56) References Cited

U.S. PATENT DOCUMENTS

| | | | |
|---|---|---|---|
| 8,797,742 B2* | 8/2014 | Kawai | H05K 7/20409 |
| | | | 361/705 |
| 8,929,078 B2* | 1/2015 | Weeber | H01L 23/552 |
| | | | 361/720 |
| 10,396,010 B2* | 8/2019 | Suzuki | H05K 7/209 |
| 10,595,393 B2* | 3/2020 | Sato | H03F 1/30 |
| 2005/0141193 A1 | 6/2005 | Otsuki et al. | |
| 2007/0264867 A1* | 11/2007 | Harmelink | H01R 13/5219 |
| | | | 439/500 |
| 2009/0086437 A1 | 4/2009 | Tsuyuno et al. | |
| 2009/0103267 A1* | 4/2009 | Wieland | H05K 7/20409 |
| | | | 29/834 |
| 2013/0063880 A1 | 3/2013 | Naruse et al. | |
| 2020/0411406 A1* | 12/2020 | Kawakita | H01L 24/29 |
| 2021/0175145 A1* | 6/2021 | Teranishi | H01L 23/373 |
| 2021/0185795 A1* | 6/2021 | Toyama | H01L 23/66 |

FOREIGN PATENT DOCUMENTS

| | | | | |
|---|---|---|---|---|
| JP | 2009-88048 A | 4/2009 | | |
| JP | 2016-219560 A | 12/2016 | | |
| JP | 2017-130514 A | 7/2017 | | |
| WO | WO 2011/145421 A1 | 11/2011 | | |
| WO | WO-2017056735 A1 * | 4/2017 | ....... | B29C 45/14836 |

OTHER PUBLICATIONS

Japanese-language Written Opinion (PCT/ISA/237) issued in PCT Application No. PCT/JP2019/025601 dated Sep. 24, 2019 (three (3) pages).

* cited by examiner

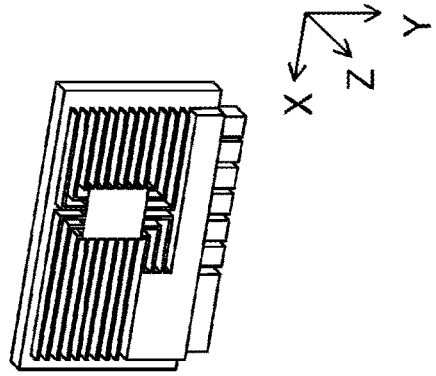
FIG. 8C
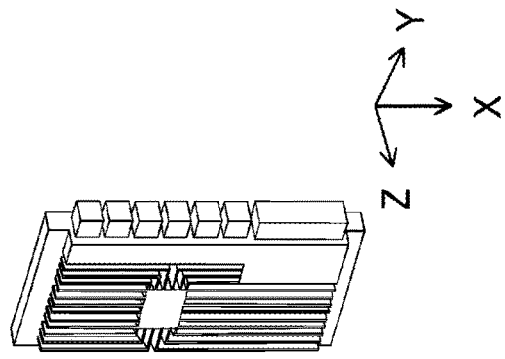
FIG. 8B
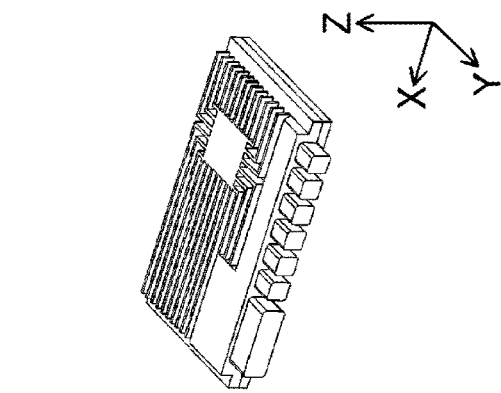
FIG. 8A
| | GRAVITY DIRECTION | | | TEMPERATURE DIFFERENCE BETWEEN JUNCTION TEMPERATURES |
|---|---|---|---|---|
| | −Z DIRECTION | X DIRECTION | Y DIRECTION | |
| COMPARATIVE EXAMPLE 1 | 126.6°C | 127.3°C | 124.2°C | 3.1°C |
| EXAMPLE 1 | 123.4°C | 122.8°C | 123.6°C | 0.8°C |
FIG. 8D

ELECTRONIC CONTROL DEVICE HAVING A HEAT RADIATION STRUCTURE

TECHNICAL FIELD

The present invention relates to an electronic control device.

BACKGROUND ART

A size of a semiconductor device used in an in-vehicle electronic control device is reduced and thus a housing volume for the semiconductor device is reduced, but a heat generation amount of the semiconductor device is increased due to higher performance. Therefore, it is required to further improve heat radiation capability of the electronic control device.

As a heat radiation structure for improving heat radiation of a semiconductor device, a semiconductor module is known, which is formed by bonding a circuit board on which the semiconductor device is mounted to a heat radiation substrate provided with a heat radiation block and a large number of pin-shaped fins arranged on an outer periphery of the heat radiation block in a soldering manner (for example, see PTL 1).

CITATION LIST

Patent Literature

PTL 1: JP 2016-219560 A

SUMMARY OF INVENTION

Technical Problem

The heat radiation structure described in PTL 1 is a structure of a semiconductor module, and an area of a heat radiation substrate is small. Therefore, heat radiation capability is not sufficient. In addition, there is no description or suggestion regarding a structure that radiates heat from a housing that accommodates a semiconductor module.

Solution to Problem

According to an aspect of the present invention, there is provided an electronic control device including a first electronic component having a first heat generation amount, a second electronic component having a second heat generation amount smaller than the first heat generation amount, a substrate on which the first and second electronic components are mounted, and a housing that accommodates the first electronic component, the second electronic component and the substrate, and includes a case for heat radiation having a heat radiation structure through which heat of the first and second electronic components is radiated, in which the heat radiation structure includes a heat radiation block that is heat-bonded to the first electronic component, and a plurality of plate-shaped heat radiation fins extending outward from an outer peripheral portion of the heat radiation block.

Advantageous Effects of Invention

According to the present invention, it is possible to provide an electronic control device having improved heat radiation.

BRIEF DESCRIPTION OF DRAWINGS

FIGS. 8A to 8D show views illustrating a junction temperature for an installation posture of Example 1 and Comparative Example 1 of the present invention, FIGS. 8A to 8C are external perspective views illustrating an installation posture of an electronic control device, and FIG. 8D is a table illustrating junction temperatures of Example 1 and Comparative Example 1 for each installation posture.

DESCRIPTION OF EMBODIMENTS

Figure 1:
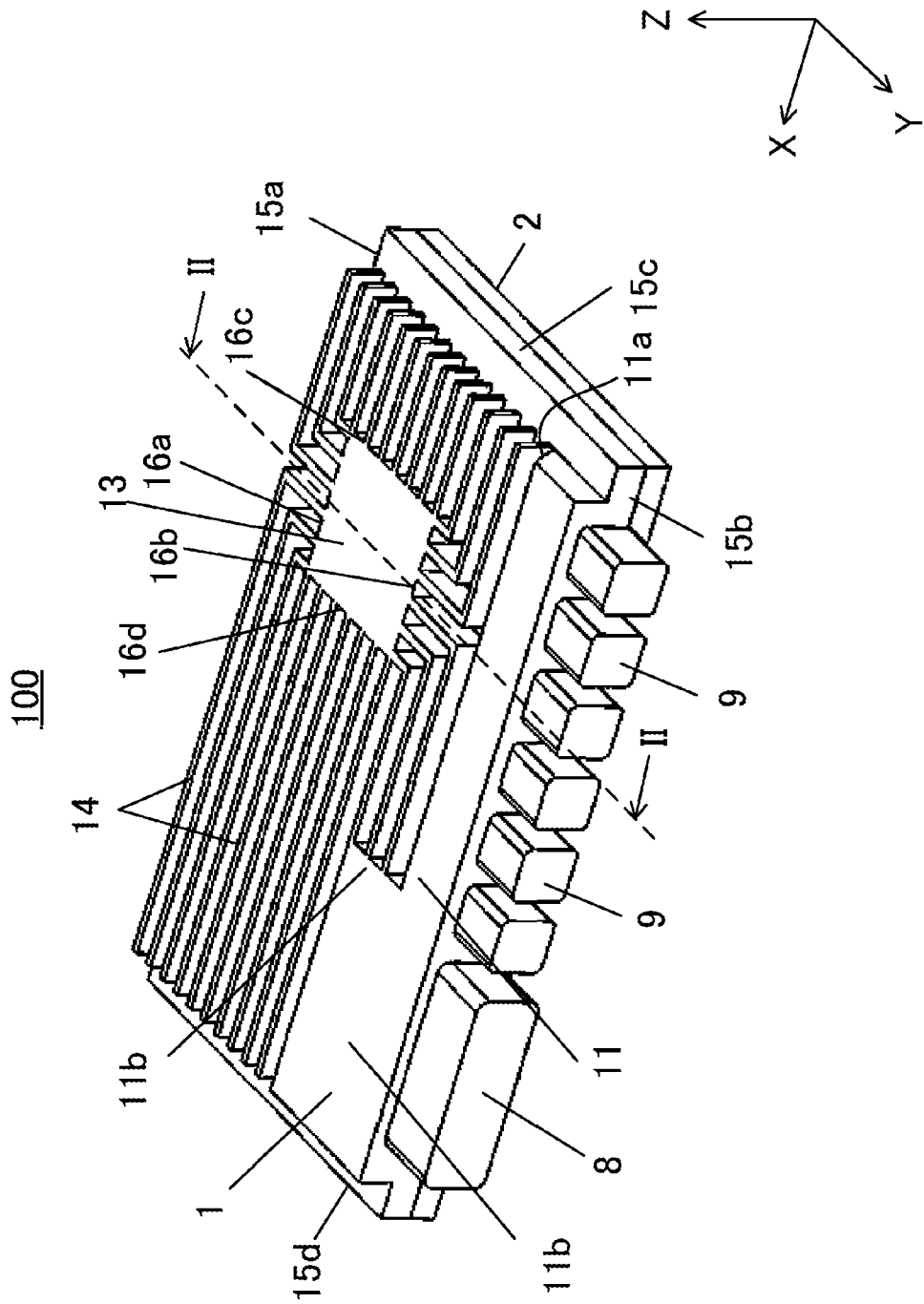
FIG. 1 is an external perspective view of an electronic control device according to a first embodiment of the present invention.

Hereinafter, embodiments of the present invention will be described with reference to the drawings. The following description and drawings are examples for explaining the present invention, and are appropriately omitted and simplified for clarifying the description. The present invention can be implemented in various other forms. Unless otherwise specified, each constituent may be singular or plural.

A position, size, shape, range, and the like of each constituent shown in the drawings may not represent an actual position, size, shape, range, and the like in order for the present invention to be easily understood. Therefore, the present invention is not necessarily limited to the position, size, shape, range, and the like disclosed in the drawings.

First Embodiment

Hereinafter, a first embodiment of the present invention will be described with reference to FIGS. 1 to 8.

Figure 2:
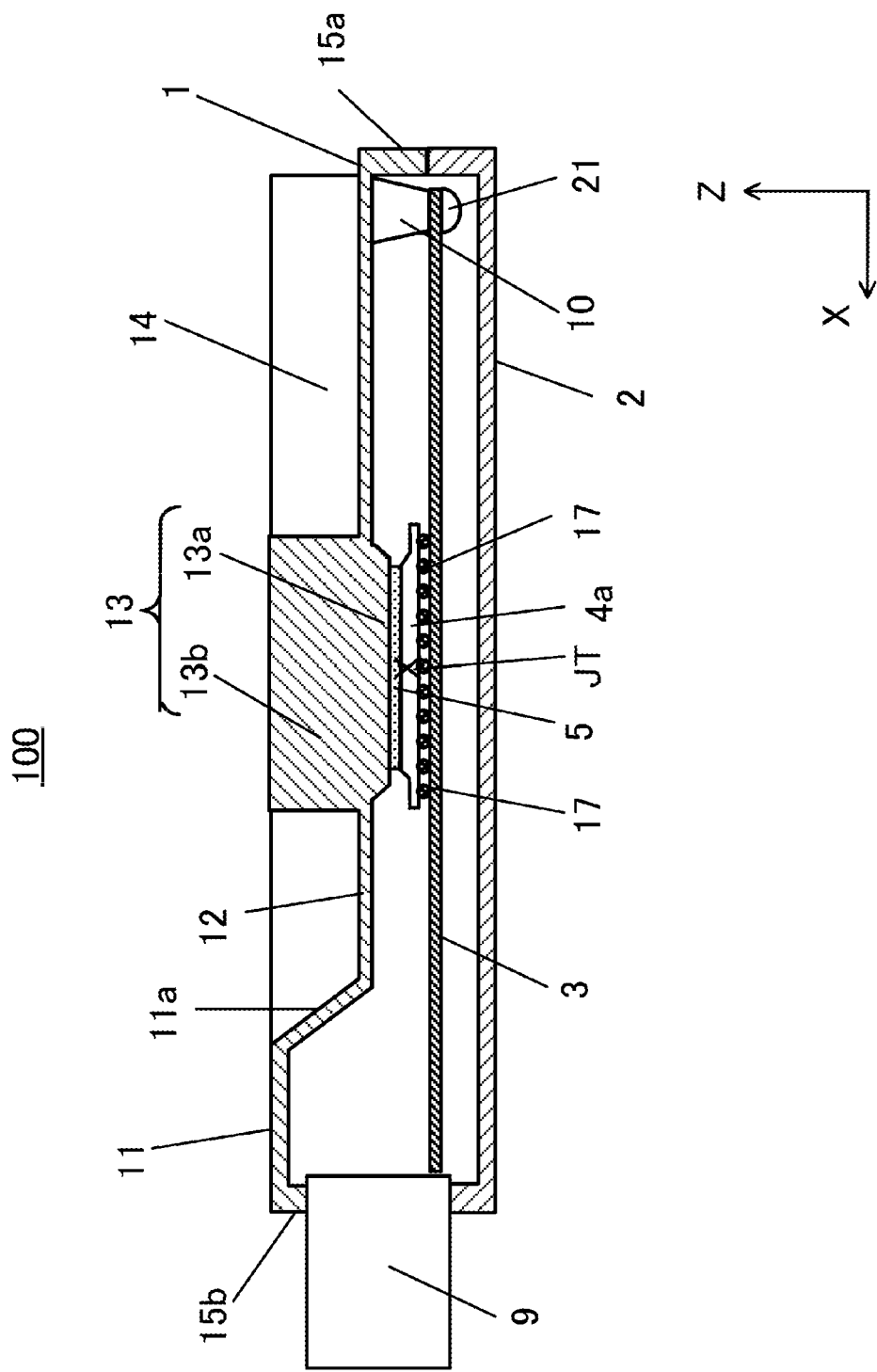
FIG. 2 is a cross-sectional view along line II-II of the electronic control device shown in FIG. 1.

FIG. 1 is an external perspective view of an electronic control device of the present invention, and FIG. 2 is a cross-sectional view along line II-II of the electronic control device shown in FIG. 1.

An electronic control device 100 includes a housing including a case for heat radiation 1 and a lower case 2. The case for heat radiation 1 and the lower case 2 are fixed by a fastening member such as a screw (not shown). One or more connectors 8 and a plurality of Ethernet (registered trademark) terminals 9 are arranged on a front side of the housing as a connection unit for electrically connecting to an external device. The connector 8 includes a connector for power supply. A circuit board 3, electronic components 4a to 4d including semiconductor devices such as a microcomputer (see FIG. 4) and a heat conductive material 5 are accommodated in the housing. The electronic components 4a to 4d may be represented by reference numeral 4.

In the following description, an X direction, a Y direction, and a Z direction are as shown in the drawings.

The case for heat radiation 1 is formed of a metal material having excellent heat conductivity such as aluminum (for example, ADC12). The case for heat radiation 1 can be formed of a sheet metal such as iron or a non-metal material such as a resin material, and cost and weight can be reduced. The case for heat radiation 1 has a rectangular shape in a plan view, and as shown in FIG. 2, a peripheral side portion of the case for heat radiation 1 is bent downward (toward the circuit board 3) by approximately 90 degrees, and is formed in a box-shape of which an opening is opened. A boss portion 10 protruding toward the circuit board 3 is provided near four corner portions or a center portion in the case for heat radiation 1. The circuit board 3 is fixed to an end of the boss portion 10 by a screw 21.

As shown in FIG. 1, a front side (Y direction) on an upper surface (Z direction) of the case for heat radiation 1 is a flat surface.

The case for heat radiation 1 includes a front surface portion 11, a main body portion 12 (see FIG. 2), a heat radiation block 13, and a plurality of plate-shaped heat radiation fins 14. The heat radiation block 13 and the heat radiation fins 14 are main elements of the heat radiation structure. The front surface portion 11, the main body portion 12, the heat radiation block 13, the heat radiation fins 14, and the boss portion 10 are integrally formed in the case for heat radiation 1 by casting such as die casting. However, the heat radiation fins 14, the heat radiation block 13, and the boss portion 10 may be manufactured as a separate member from the front surface portion 11 and the main body portion 12, and attached to the front surface portion 11 and the main body portion 12 by fastening members or by welding.

A hole or cut-away portion (not shown) for inserting the connector 8 and the Ethernet terminal 9 is formed on a side wall in the front side of the case for heat radiation 1, and the connector 8 and the Ethernet terminal 9 are connected to a wiring pattern (not shown) formed on a circuit board 3 through the hole or cut-away portion. Electric power and a control signal between the outside and the electronic control device 100 are transmitted and received via the connector 8 and the Ethernet terminal 9.

Similar to the case for heat radiation 1, the lower case 2 is formed of a metal material having excellent heat conductivity such as aluminum. Similar to the case for heat radiation 1, the lower case 2 can be formed of a sheet metal such as iron or a non-metal material such as a resin material, and cost and weight can be reduced. The hole or cut-away portion for inserting the connector 8 or the Ethernet terminal 9 may be formed in the lower case 2. Alternatively, the cut-away portion as one hole may be formed in each of the case for heat radiation 1 and the lower case in a state where both members are assembled.

The front surface portion 11 of the case for heat radiation 1 includes a covering portion that covers the Ethernet terminal 9 and a covering portion that covers the connector 8. The main body portion 12 is a plate-shaped member that covers the circuit board 3 and a heat generation component 4 accommodated in the housing, and connects the plurality of heat radiation fins 14 and the heat radiation block 13. A boundary portion between the main body portion 12 and the front surface portion 11 is an inclined surface 11a that inclines downward (−Z direction) from the front surface portion 11, and the main body portion 12 is located at a position lower than the front surface portion 11 (a position in a −Z side). Each of the heat radiation fins 14 are connected to the main body portion 12 in a lower end. Further, the heat radiation block 13 includes an outer raised portion 13b protruding upward (Z direction) from the main body portion 12 and an inner raised portion 13a protruding downward (−Z direction) from the main body portion 12, in other words, toward the inside of the housing. An inner raised portion 13a is a protrusion that protrudes from the surface on the main body portion 12 in the −Z direction toward the circuit board 3, and a side peripheral surface of the inner raised portion 13a is formed as the inclined surface such that the inner raised portion 13a is formed in a tapered shape in the −Z direction. That is, an XZ cross-section and a YZ cross-section of the inner raised portion 13a have a substantially trapezoidal shape having a wide bottom portion in the main body portion 12 side.

As shown in FIG. 2, the front surface portion 11 of the case for heat radiation 1 is provided with the inclined surface 11a that inclines toward the main body portion 12, and a height (Z direction) of each heat radiation fin 14 from the main body portion 12 and a height (Z direction) of the outer raised portion 13b of the heat radiation block 13 from the main body portion 12 is almost the same. That is, an upper surface of each heat radiation fin 14 in the Z direction and an upper surface of the heat radiation block 13 in the Z direction are substantially flush with the upper surface of the front surface portion 11 of the case for heat radiation 1. In this way, by making the upper surface of each heat radiation fin 14 in the Z direction and the upper surface of the heat radiation block 13 flush with the upper surface of the front surface portion 11, of which a height is a maximum height of the case for heat radiation 1, a height of the electronic control device 100 may be lowered.

Figure 3:
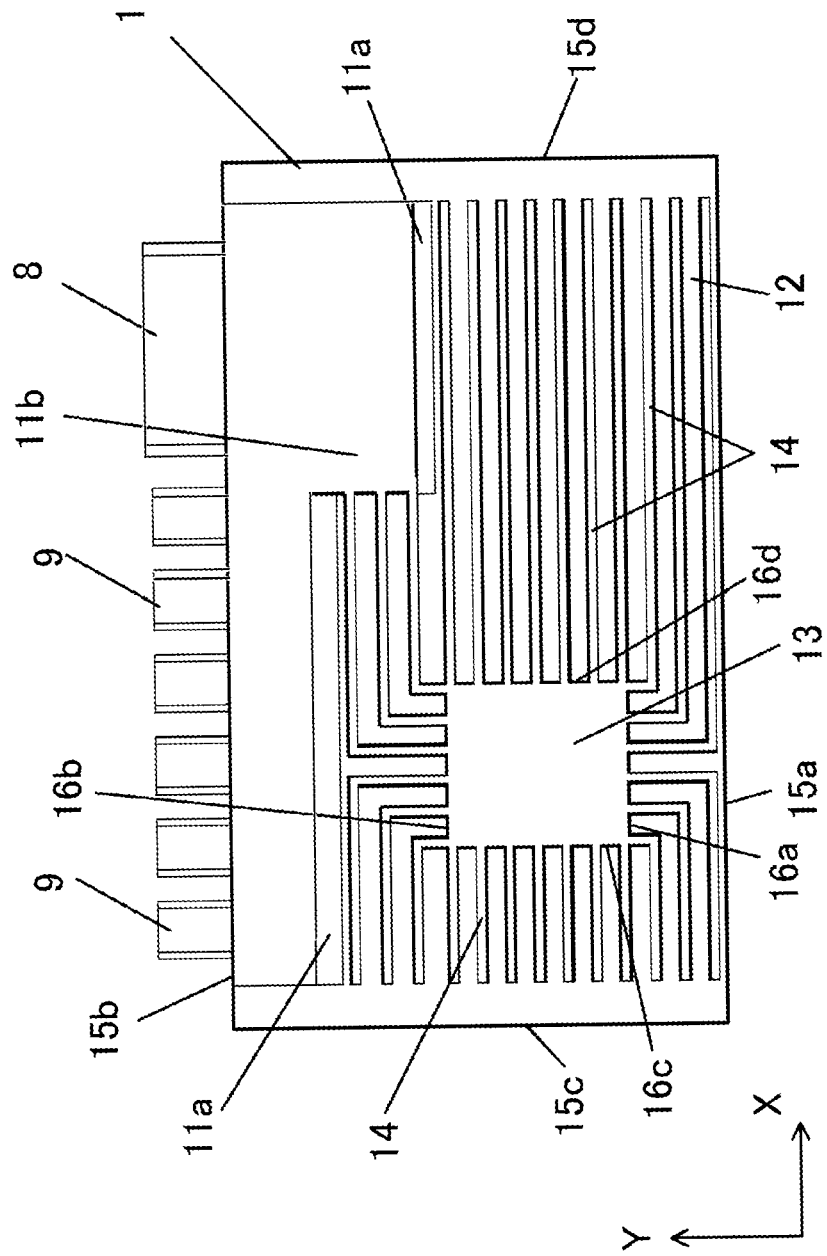
FIG. 3 is a top view of the electronic control device shown in FIG. 1.

FIG. 3 is a top view of the electronic control device shown in FIG. 1.

The case for heat radiation 1 has a thin rectangular parallelepiped shape in which a length in the X direction is greater than a length in the Y direction, and a peripheral side portion formed of a pair of side portions (side portions in a longitudinal direction) 15a and 15b extending in the X direction and a pair of side portions (side portions in a lateral direction) 15c and 15d extending in the Y direction.

As shown in FIGS. 2 and 3, the heat radiation block 13 is a thin member having a square or rectangular shape in a plan view, and has a pair of sides 16a and 16b extending in the X direction and a pair of sides 16c and 16d extending in the Y direction. The heat radiation block 13 is disposed slightly on the −X side with respect to the center portion in the X direction which is the longitudinal direction of the case for heat radiation 1, in other words, is disposed close to the side portion 15c. Further, the heat radiation block 13 is disposed in substantially the center portion between the inclined surface 11a of the front surface portion 11 of the case for heat radiation 1 and the side portion 15a in the Y direction.

As will be described later, the heat radiation block 13 mainly aims to radiate heat of an electronic component that generates a large amount of heat, and it is preferable that the size of the heat radiation block in a plan view is determined based on the size of the electronic component that radiates heat in a plan view.

In each of the sides 16a to 16d of the heat radiation block 13, a plurality of heat radiation fins 14 extend in four directions from each of the sides. In other words, a plurality of heat radiation fins connected to the side 16c of the heat radiation block 13 extend in parallel in the −X direction, and are connected to the side portion 15c of the case for heat radiation 1. A plurality of heat radiation fins 14 connected to the side 16d of the heat radiation block 13 extend in parallel in the X direction and, are connected to the side portion 15d of the case for heat radiation 1. A plurality of heat radiation fins 14 connected to the side 16a of the heat radiation block 13 extend in parallel in the −Y direction, and are bent by 90 degrees toward the side portion 15c or the side portion 15d at different positions in the Y direction. That is, half of the plurality of heat radiation fins 14 connected to the side 16a of the heat radiation block 13, which are located close to the side 16c of the heat radiation block 13, are bent by 90 degrees toward the side portion 15c, and extend in parallel in the −X direction to be connected to the side portion 15c of the case for heat radiation 1. Half of the plurality of heat radiation fins 14 connected to the side 16a of the heat radiation block 13, which are located close to the side 16d of the heat radiation block 13, are bent by 90 degrees toward the side portion 15d, and extend in parallel in the −X direction to be connected to the side portion 15d of the case for heat radiation 1.

The plurality of heat radiation fins 14 connected to the side 16b of the heat radiation block 13 extend in parallel in the Y direction, and are bent by 90 degrees toward the side portion 15c or the side portion 15d at different positions in the Y direction. That is, half of the plurality of heat radiation fins 14 connected to the side 16b of the heat radiation block 13, which are located close to the side 16c of the heat radiation block 13, are bent by 90 degrees toward the side portion 15c, and extend in parallel in the −X direction to be connected to the side portion 15c of the case for heat radiation 1. Half of the plurality of heat radiation fins 14 connected to the side 16b of the heat radiation block 13, which are located close to the side 16d of the heat radiation block 13, are bent by 90 degrees toward the side portion 15d, and extend in parallel in the X direction to be connected to a protruding portion 11b of the front surface portion 11.

As can be seen from the above description and the drawings, the heat radiation block 13 of the case for heat radiation 1 is disposed in a position closer to one side, i.e., the side portion 15c extending in the Y direction which is a lateral direction, with respect to the center portion of the case for heat radiation 1 in the X direction which is a longitudinal direction. Some of the plate-shaped heat radiation fins 14 extend in the X direction which is a longitudinal direction of the case for heat radiation 1 as a total length. The remaining of the plate-shaped heat radiation fins 14 has a portion extending in parallel in the lateral direction of the case for heat radiation 1 and a portion extending in parallel in the longitudinal direction. In all of the remaining of the plate-shaped heat radiation fins 14, the length of the portion extending in parallel in the longitudinal direction is longer than the length of the portion extending in parallel in the lateral direction. That is, in all of the plate-shaped heat radiation fins 14 connected to the four sides of the case for heat radiation 1, the length of the portion extending in the longitudinal direction of the case for heat radiation 1 is longer than the length of the portion extending in the lateral direction of the case for heat radiation 1.

Figure 4:
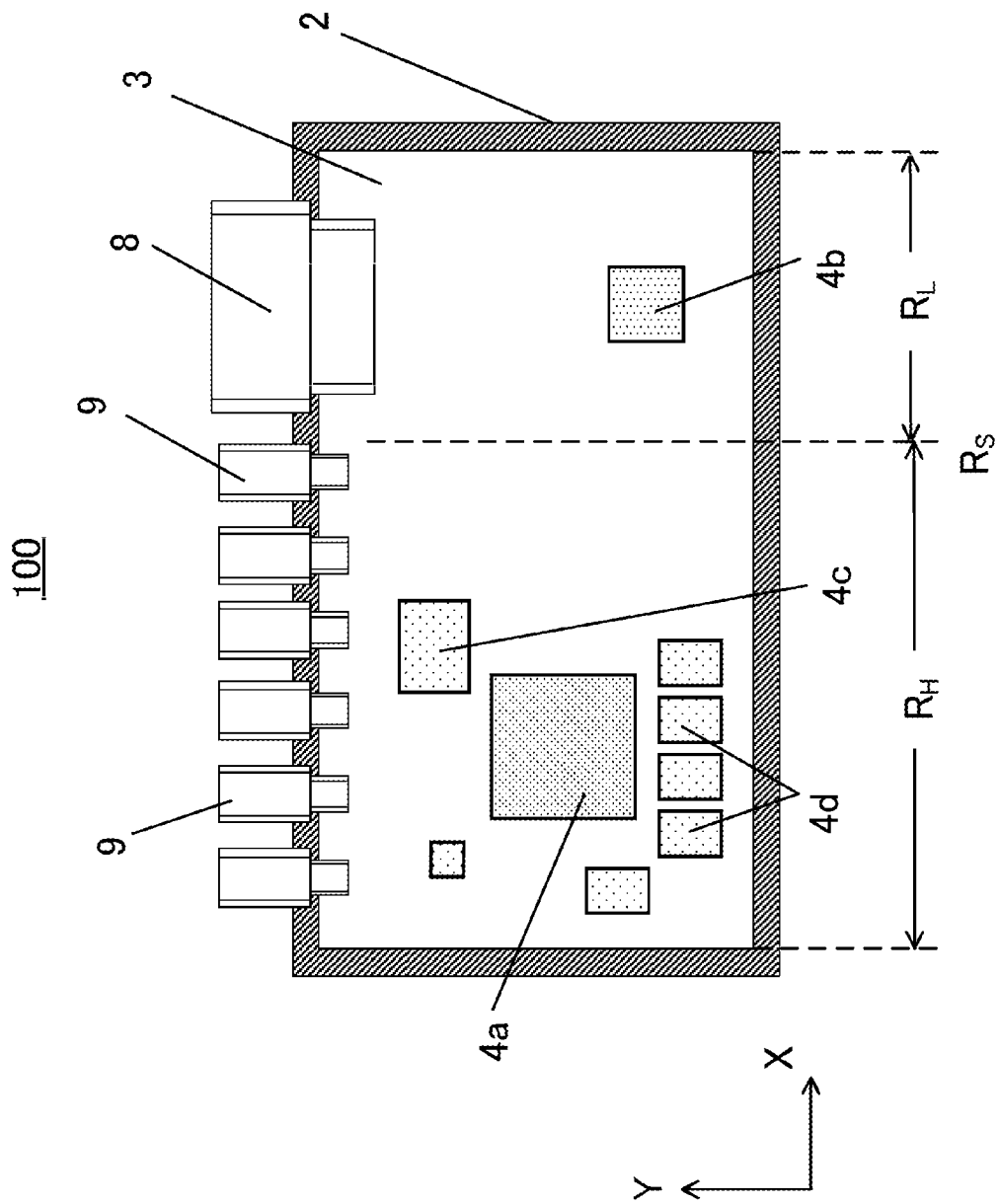
FIG. 4 is a plan view illustrating a layout inside a housing of the electronic control device shown in FIG. 3.

FIG. 4 is a plan view illustrating a layout inside a housing of the electronic control device shown in FIG. 3.

As shown in FIGS. 2 and 4, the electronic components 4a to 4d are mounted on the circuit board 3.

The electronic component 4a has the largest heat generation amount among the electronic components 4a to 4d mounted on the circuit board 3. The electronic component 4b has the second largest heat generation amount to that of the electronic component 4a. The electronic components 4c and 4d generate less heat than the electronic component 4b.

A mounting structure of the electronic component 4a will be described with reference to FIG. 2.

The electronic component 4a is thermally conductive bonded to a connection pad (not shown) formed on the circuit board 3 by a conductive bonding material 17 such as solder, that is, thermally connected to the connection pad. The circuit board 3 is formed of an organic material such as an epoxy resin. The circuit board 3 is preferably formed of a FR4 material. The circuit board 3 may be a single-layer substrate or a multi-layer substrate. Although not shown in the drawings, the circuit board 3 is provided with a connection unit to which the connector 8 and the Ethernet terminal 9 are connected, and a wiring pattern.

A heat conductive material 5 (FIG. 2) is interposed between the electronic component 4a and the inner raised portion 13a of the heat radiation block 13. The area of a lower surface (−Z direction) of the inner raised portion 13a facing the electronic component 4a (a length in the X direction×a length in the Y direction) is equal to or larger than the area of a heat generating surface of the electronic component 4a.

As the heat conductive material 5, various kinds of materials such as grease, gel, and sheet are used. A grease-like heat conductive material is generally used, and examples thereof include a thermosetting resin having adhesiveness, and a semi-cured resin having low elasticity. The heat conductive material 5 contains a filler formed of metal, carbon, ceramic, and the like and having good heat conductivity. The heat conductive material 5 is preferably a semi-cured resin having a flexibility that is deformable by deformation by heat and vibration of the circuit board 3, and a tolerance made at the time of manufacturing, for example, the semi-cured resin using a silicone-based resin containing a ceramic filler.

The heat generated in the electronic component 4a is conducted to the heat radiation block 13 of the case for heat radiation 1 via the heat conductive material 5, the heat radiation block being formed of a material having good heat conductivity. The heat conducted to the heat radiation block 13 is radiated to the outside from the upper surface of the heat radiation block 13, that is, from the upper surface of the outer raised portion 13b in the +Z direction, and is also conducted to each of the plate-shaped heat radiation fins 14. The area of the lower surface (−Z direction) of the heat radiation block 13, in other words, the area of the surface which is heat-bonded to the electronic component 4a is larger than the area of a heat radiation surface of the electronic component 4a. The height of the heat radiation block 13 including the inner raised portion 13a in the Z direction is greater than the height of the heat radiation fins 14.

Since the height of the heat radiation block 13 in the Z direction and an XY dimension are set in this way, a heat capacity of the heat radiation block 13 can be set relatively large. Therefore, the heat radiation block 13 can quickly absorb the heat generated in the electronic component 4a and can withstand a temporary temperature increase (transient heat) of the heat generation component 4. As a heat conduction area increases, heat resistance decreases and the heat is easily conducted. Therefore, the use of the heat radiation block 13 having a large heat capacity is effective in improving the heat radiation. The heat radiation fins 14 extend in parallel mainly in the longitudinal direction of the case for heat radiation 1 from each of the sides 16a to 16d of the heat radiation block 13. Therefore, since the total length of the plurality of heat radiation fins 14, that is, the total length of the heat conduction path of the heat radiation fins 14 can be set large, the heat radiation area is large. Further, a majority of the ends of the heat radiation fins 14 in the X direction are connected to the side portions 15c and 15d of the case for heat radiation 1, and some of the ends are connected to the protruding portion 11b. Therefore, the heat radiation by the heat radiation block 13 and the heat radiation fins 14 can be improved.

Returning to FIG. 4, the electronic components 4a, 4c, and 4d mounted on the circuit board 3 are disposed in a first region $R_H$ in the X direction on an XY plane, and the electronic component 4b is disposed in a second region $R_L$ in the X direction on the XY plane.

The electronic component 4a is, for example, an electronic circuit for arithmetic processing such as a field-programmable gate array (FPGA) or an ASIC having a large heat generation amount, and the electronic component 4b has a heat generation amount smaller than that of the electronic component 4a, for example, a microcomputer. The electronic component 4c is a passive element such as a microcomputer, a resistor, or a capacitor, which has a heat generation amount equal to or smaller than that of the electronic component 4b, and the electronic component 4d is a passive element such as a memory chip, a resistor or a capacitor, which has a heat generation amount equal to or smaller than that of the electronic component 4c.

The electronic components 4c and 4d are disposed in the vicinity of the electronic component 4a by surrounding the electronic component 4a, and the first region $R_H$ in which the electronic components 4a, 4c and 4d are mounted is a high heat generation region. The second region $R_L$ in which the electronic component 4b is disposed is a low heat generation region in which the heat generation amount in the second region $R_L$ is smaller than that in the first region $R_H$. The electronic component 4b is disposed in a position in which the electronic component 4b is separated from the electronic component 4a in the longitudinal direction. A separation distance between the electronic component 4b and the electronic component 4a is larger than a separation distance between the electronic component 4c or the electronic component 4d and the electronic component 4a.

A boundary line $R_S$ between the first region $R_H$ and the second region $R_L$ is positioned between the electronic component 4a and the electronic component 4b. However, in a layout in which another electronic component 4e (not shown) of which a heat generation amount is equal to or larger than the electronic component 4b is disposed in a region between the electronic component 4a and the electronic component 4b, the boundary line $R_S$ is can be set in any one of a region between the electronic component 4a and the other electronic component 4e or a region between the electronic component 4b and the other electronic component 4e. Therefore, the first region $R_H$ is defined as a region in which the heat generation amount of the first region $R_H$ is larger than that of the second region $R_L$, and a position of the boundary line $R_S$ between the first region $R_H$ and the second region $R_L$ is appropriately determined based on the definition.

The Ethernet terminal 9 is arranged at an end of the first region $R_H$ in the Y direction (the side portion 15b of the case for heat radiation 1), and is connected to the circuit board 3 in the first region $R_H$. The connector 8 including a connector for power supply is disposed at an end of the second region $R_L$ in the Y direction (the side portion 15b of the case for heat radiation 1), and is connected to the circuit board 3 in the second region $R_L$. The connector 8 including a connector for power supply generates a large amount of heat compared to the Ethernet terminal 9. In this embodiment, the Ethernet terminal 9 is arranged in the first region $R_H$ having a large heat generation amount, and the connector 8 is disposed in the second region $R_L$ which is a low heat generation region. Accordingly, the heat generation amount and heat radiation amount generated in the first region $R_H$, and the heat generation amount and heat radiation amount in the second region $R_L$ can be balanced, and the heat radiation of the entire electronic control device 100 can be improved.

As described above, since the heat radiation block 13 has a large heat capacity, the heat generated in the electronic component 4a is immediately absorbed by the heat radiation block. The heat absorbed by the heat radiation block 13 is radiated to the outside from the heat radiation block 13 and is also conducted to each of the plate-shaped heat radiation fins 14.

Compared with the technique in the related art in which a pin is erected around the heat radiation block to ensure heat radiation capability, in the present invention, the overall heat radiation capability is improved in various efforts to dispose the heat radiation block such that fins are provided on the side surface of the heat radiation block and the fins extend in the longitudinal direction of the case for heat radiation.

As described above, the heat radiation block 13 is disposed in a position slightly closer to the side portion 15c with respect to the center portion of the case for heat radiation 1 in the X direction. In other words, the distance between the side 16d of the heat radiation block 13 and the side portion 15d of the case for heat radiation 1 is greater than the distance between the side 16c of the heat radiation block 13 and the side portion 15c of the case for heat radiation 1. That is, the length of the heat radiation fins 14 connected to the side portion 15d of the case for heat radiation 1 from the side 16d of the heat radiation block 13 via the second region $R_L$ is large. The heat generated in the electronic component 4a and conducted to the heat radiation block 13 is transferred to the side portion 15d of the case for heat radiation 1 from the first region $R_H$ having a large heat generation amount via the second region $R_L$ having a small heat generation amount while being conducted through the plurality of plate-shaped heat radiation fins 14 to be radiated to the outside.

In a natural air-cooling environment, the effect of heat radiation by heat transfer of a cooling medium is small, and heat radiation is improved by reducing the temperature gradient of the object by heat conduction and radiating the heat. Therefore, the heat generated in the electronic component 4a is effectively conducted to the entire case for heat radiation 1 and radiated to improve heat radiation.

Example 1

An electronic control device 100 having an appearance shown in FIGS. 1 and 3, the cross-sectional structure shown in FIG. 2, and the layout inside the housing shown in FIG. 4 was manufactured using the following members. The circuit board 3 was fixed to four corner portions of the case for heat radiation 1 and the boss portion 10 provided in the center portion by a screw 21.

The electronic component 4a, which has the largest heat generation amount, was formed as a ball grid array (BGA) type semiconductor device having a size of 31 mm×31 mm×3.1 mm (thickness), and was mounted on the circuit board 3 by soldering. The electronic components 4b to 4d were mounted on the circuit board 3 in an arrangement shown in FIG. 4.

The circuit board 3 was formed of a FR4 material having a size of 187 mm×102.5 mm×1.6 mm (thickness). The circuit board 3 is an eight-layer substrate, and the heat conductivity thereof is 69 W/mK in an in-plane direction and 0.45 W/mK in a vertical direction.

The case for heat radiation 1 and the lower case 2 were formed by using an ADC12 having heat conductivity of 96 W/mK and emissivity of 0.8.

The heat conductive material 5 was formed by using a low-elastic heat radiation material containing a heat conductive filler in a silicone resin, the low-elastic heat radiation material having heat conductivity of 2 W/mK. The heat conductive material 5 was provided on all the electronic components 4a to 4d. The size of the heat conductive material 5 provided on each of the electronic components 4a to 4d is the same as the size of each of the electronic components 4a to 4d provided with the heat conductive material 5. All the heat conductive materials 5 had the same thickness of 1.9 mm. Only the inner raised portion 13a of the heat radiation block 13 is formed on each of the electronic components 4a to 4d of the case for heat radiation 1, and the upper portion of the heat conductive material 5 provided on each of the electronic components 4a to 4d was connected to the inner raised portion 13a of the heat radiation block 13. The thickness of the inner raised portion 13a was different depending on the thickness of each of the electronic components 4a to 4d, and a main body portion 12 of the case for heat radiation 1 was flat in a horizontal direction.

Figure 5:
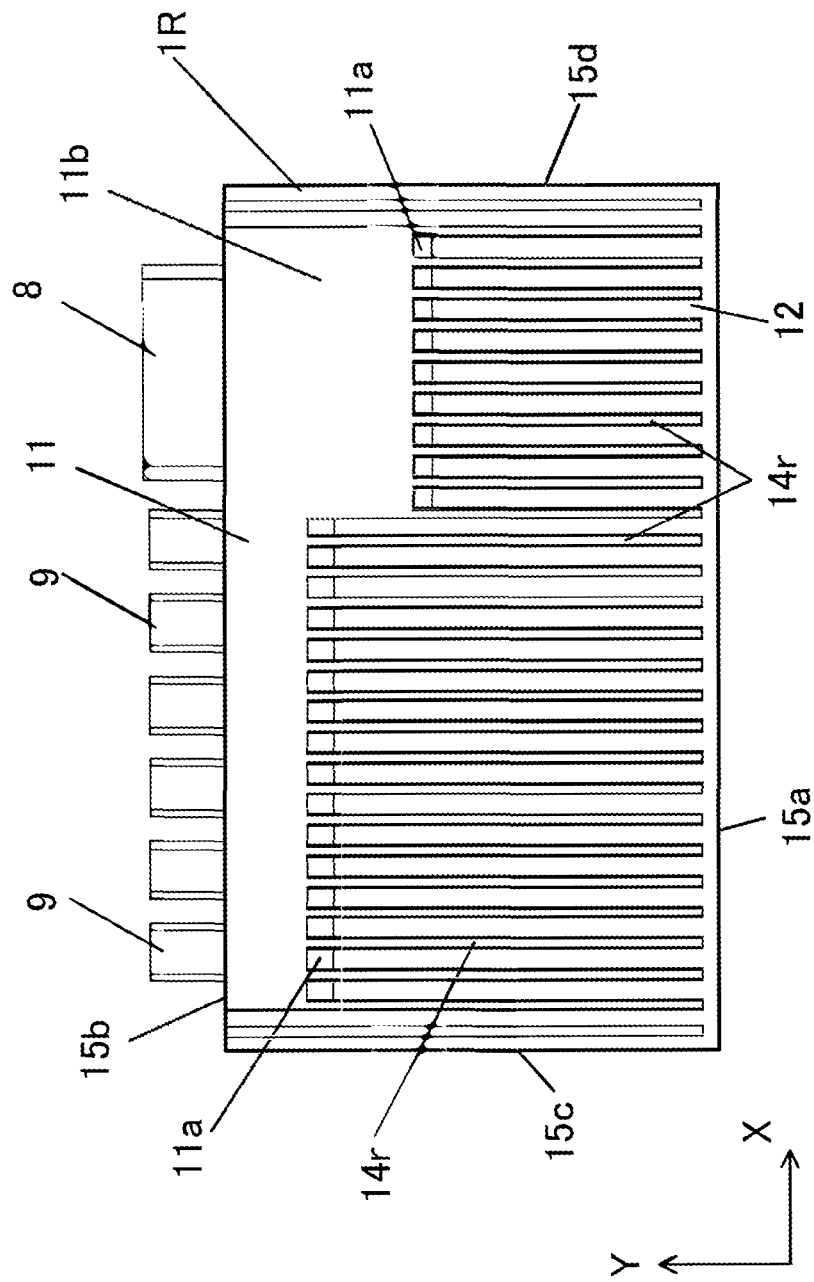
FIG. 5 is a top view of an electronic control device of a comparative example.

FIG. 5 is a top view of an electronic control device of a comparative example.

As Comparative Example 1, an electronic control device 101 having a case for heat radiation 1R shown in FIG. 5 was manufactured.

The case for heat radiation 1R of Comparative Example 1 does not include a heat radiation block. All of plate-shaped heat radiation fins 14r of the case for heat radiation 1R of Comparative Example 1 extend in a Y direction which is a lateral direction of the case for heat radiation 1R, and does not extend in an X direction which is a longitudinal direction of the case for heat radiation 1R.

That is, all of the plate-shaped heat radiation fins 14r of Comparative Example 1 extend linearly in the Y direction from a side portion 15a of the case for heat radiation 1R, and are connected to a side portion 15b or a front surface portion 11 facing the side portion 15a.

Other configurations of Comparative Example 1 are the same as those of Example 1.

Figure 6:
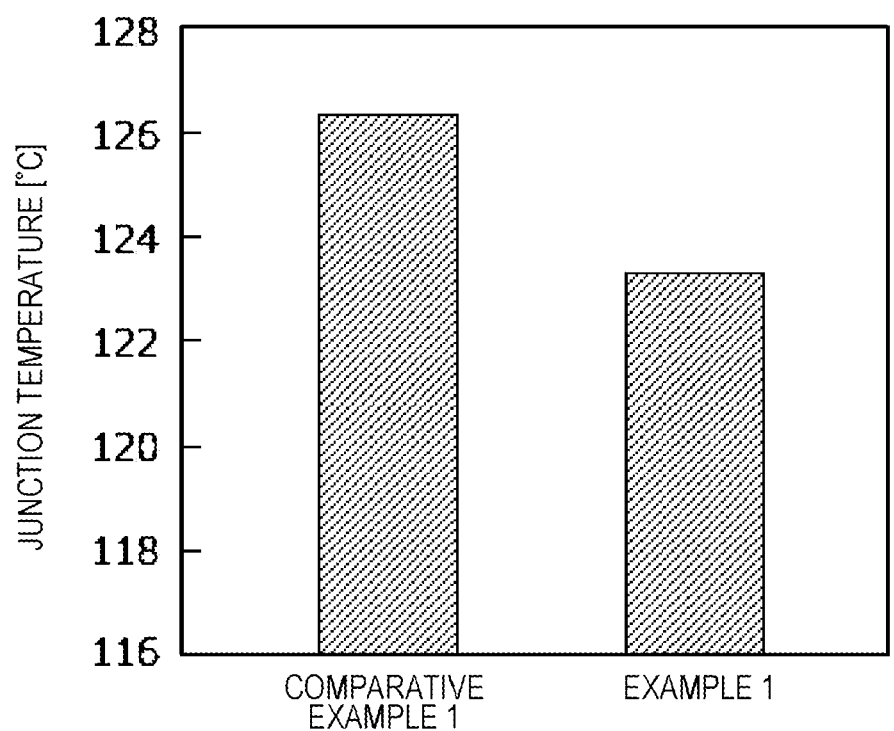
FIG. 6 is a graph illustrating a junction temperature of Example 1 and Comparative Example 1 of the present invention.

FIG. 6 is a graph illustrating a junction temperature of Example 1 and Comparative Example 1 of the present invention.

FIG. 6 illustrates a junction temperature of the electronic component 4a having the largest heat generation amount of each of the electronic control device 100 of Example 1 and the electronic control device 101 of Comparative Example 1. The junction temperature is a temperature approximately of a center portion JT on one side of an outer peripheral side of the electronic component 4a shown in FIG. 2.

The junction temperature shown in FIG. 6 is a temperature in a windless environment and an environmental temperature of 85° C. when a heat generation amount of the entire electronic control devices 100 and 101 is 20 W (including 9 W of the heat generation amount of the electronic component 4a). As shown in FIG. 6, the junction temperature of the electronic component 4a of Example 1 was lower than the junction temperature of the heat generation component 4a of Comparative Example 1. Accordingly, it was confirmed that the electronic control device 100 of Example 1 had a better heat radiation effect than the electronic control device 101 of Comparative Example 1.

Figure 7:
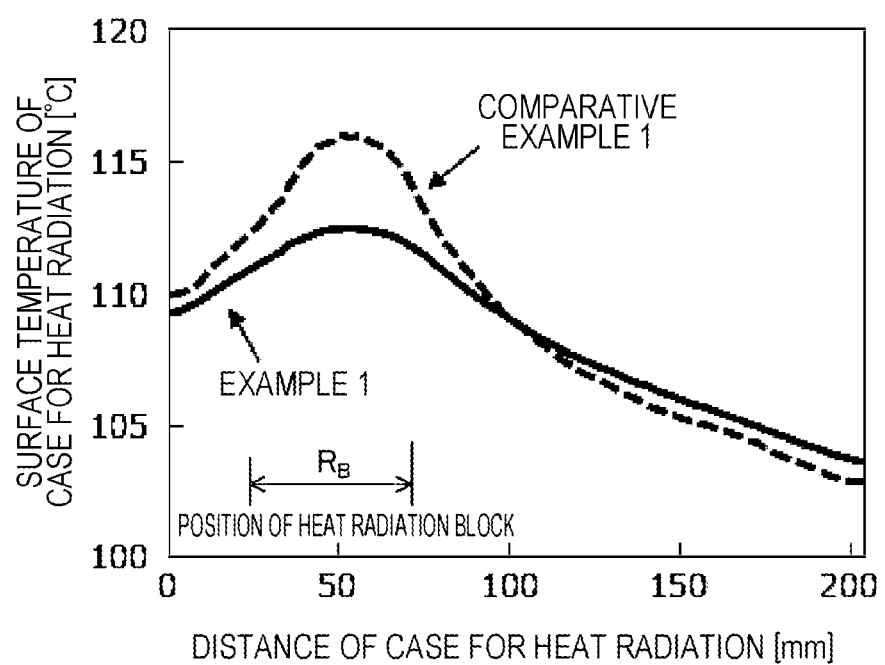
FIG. 7 is a graph illustrating a surface temperature of a case for heat radiation of Example 1 and Comparative Example 1 of the present invention.

FIG. 7 is a graph illustrating a surface temperature of a case for heat radiation of Example 1 and Comparative Example 1 of the present invention.

FIG. 7 illustrates a surface temperature of the case for heat radiation 1 of the electronic control device 100 of Example 1 and the case for heat radiation 1R of the electronic control device 101 of Comparative Example 1. A distance of the case for heat radiation, which is the horizontal axis in FIG. 7, is a distance from the side portion 15c of the cases for heat radiation 1 and 1R in a −X direction in FIGS. 3 and 5. A surface temperature of the case for heat radiation, which is a vertical axis in FIG. 7, is a measurement temperature substantially in the center portion of the cases for heat radiation 1 and 1R in the Y direction.

The heat radiation block 13 of Example 1 is disposed in a position where the distance of the case for heat radiation is about 30 mm to 80 mm.

As shown in FIG. 7, the surface temperature of the case for heat radiation of Example 1 was lower than the surface temperature of the case for heat radiation of Comparative Example 1 in an entire region $R_B$ in which the heat radiation block 13 is located. It is considered that this is because the heat which the heat radiation block 13 absorbs from the electronic component 4a is conducted to the heat radiation fins 14 and transferred to a peripheral edge of the case for heat radiation 1.

As shown in FIG. 7, the surface temperature of the case for heat radiation 1 of Example 1 is higher than the surface temperature of the case for heat radiation 1R of Comparative Example 1 when the distance of the case for heat radiation exceeds 100 mm. That is, a difference between the maximum temperature and the minimum temperature of the surface temperature of the case for heat radiation 1 of Example 1 is smaller than a difference between the maximum temperature and the minimum temperature of the surface temperature of the case for heat radiation 1R of Comparative Example 1. This can be explained as follows.

In the case for heat radiation 1 of Example 1, the heat absorbed by the heat radiation block 13 is sufficiently radiated from the heat radiation fins 14 while the heat is conducted to the side portion 15d of the case for heat radiation 1 in the X direction via the second region $R_L$ where the heat generation amount is small through the heat radiation fins 14. Therefore, it could be confirmed that the electronic control device 100 of Example 1 had a better heat radiation effect than the electronic control device 101 of Comparative Example 1, and the maximum temperature of the case for heat radiation 1 was reduced more than the maximum temperature of the case for heat radiation 1R of Comparative Example 1.

FIG. 8 shows views illustrating a junction temperature for an installation posture of Example 1 and Comparative Example 1 of the present invention, FIGS. 8(a) to 8(c) are external perspective views illustrating an installation posture of an electronic control device, and FIG. 8 (d) is a table illustrating junction temperatures of Example 1 and Comparative Example 1 for each installation posture. The postures in FIGS. 8(a) to 8(c) are as shown in the drawings, but FIG. 8(a) illustrating an XY plane as a horizontal surface on which the electronic control device is mounted is an example in which the electronic control devices 100 and 101 are installed such that a gravity direction is a −Z direction. FIG. 8 (b) illustrates an example in which the electronic control devices 100 and 101 are installed such that the gravity direction is a +X direction. In other words, the first region $R_H$ is set in a −X direction which is a side opposite to the gravity direction from the second region $R_L$ and the connector 8 and the Ethernet terminal 9 are installed to face in a +Y direction.

FIG. 8 (*c*) illustrates an example in which the electronic control devices 100 and 101 are installed such that the gravity direction is the +Y direction. In other words, when the gravity direction is the Y direction, the connector 8 and Ethernet terminal 9 are installed to face in a +Y direction which is the gravity direction.

As shown in FIG. 8 (*d*), the junction temperature of Example 1 was lower than the junction temperature of Comparative Example 1 in all the installation postures. The temperature difference between the junction temperatures in different installation postures was 3.1° C. in Comparative Example 1, and 0.8° C. in Example 1. That is, in the temperature difference between the junction temperatures in the different installation postures, the temperature difference in the electronic control device 100 of Example 1 was smaller than the temperature difference in the electronic control device 101 of Comparative Example 1.

Accordingly, it was confirmed that the electronic control device 100 of Example 1 had a better heat radiation effect than the electronic control device 101 of Comparative Example 1 and the maximum junction temperature was reduced in all of the installation postures.

According to the electronic control device 100 of the first embodiment, the following effects are obtained.

(1) The electronic control device 100 includes a first electronic component 4*a* having a first heat generation amount, a second electronic component 4*b* having a second heat generation amount smaller than the first heat generation amount, a circuit board 3 on which the first and second electronic components 4*a* and 4*b* are mounted, and a housing that accommodates the first electronic component 4*a*, the second electronic component 4*b* and the circuit board 3, and includes a case for heat radiation 1 having a heat radiation structure through which heat of the first and second electronic components 4*a* and 4*b* is radiated. The heat radiation structure includes a heat radiation block 13 which is heat-bonded to the first electronic component 4*a*, and a plurality of plate-shaped heat radiation fins 14 extending outward from an outer peripheral portion of the heat radiation block 13.

As described above, since the heat radiation fins 14 extend outward from the outer peripheral portion of the heat radiation block 13, and the first electronic component 4*a* having a large heat generation amount is heat-bonded to the heat radiation block 13, the heat radiation can be improved.

(2) At least some of the heat radiation fins 14 extend from the outer peripheral portion of the heat radiation block 13 toward the second electronic component 4*b*, and are connected to a peripheral side portion 15 of the case for heat radiation 1. Therefore, since the heat generated in the electronic component 4*a* is smoothly transferred from the electronic component 4*a* having a large heat generation amount to a side portion 15*d* of the case for heat radiation 1 via the electronic component 4*b* having a small heat generation amount, the heat is efficiently radiated.

(3) The electronic control device 100 includes a circuit board 3, an electronic component 4*a* having a large heat generation amount, an electronic component 4*b* having a heat generation amount smaller than that of the electronic component 4*a*, and a housing including a case for heat radiation 1. The case for heat radiation 1 includes a heat radiation block 13 that is heat-bonded to the electronic component 4*a*, and a plurality of plate-shaped heat radiation fins 14 provided on the outer peripheral portion of the heat radiation block 13, and at least some of the heat radiation fins 14 extend toward the electronic component 4*b* to be connected to a peripheral side portion. Therefore, the heat generated in the electronic component 4*a* is absorbed by the heat radiation block 13, and transferred from the electronic component 4*a* having a large heat generation amount to the side portion 15*d* of the case for heat radiation 1 via the electronic component 4*b* having a small heat generation amount while being radiated to the outside. Accordingly, the heat radiation can be improved.

(4) The case for heat radiation 1 includes a main body portion 12 that holds a plurality of the heat radiation fins 14 and the heat radiation block 13, the plurality of heat radiation fins 14 have a predetermined height with which the heat radiation fins protrude substantially perpendicular to an opposite side of the first electronic component 4*a* from the main body portion 12, and the heat radiation block 13 includes an inner raised portion 13*a* that protrudes to the first electronic component 4*a* from the main body portion 12 and an outer raised portion 13*b* having a predetermined height with which the outer raised portion protrudes to the opposite side of the first electronic component 4*a* from the main body portion 12. Accordingly, the electronic control device 100 is provided in which the height thereof is reduced, heat capacity of the heat radiation block 13 is increased, the height of the heat radiation fins 14 (the length in the Z direction) is increased, and the heat radiation is improved.

(5) The electronic control device 100 further includes a connector 8 attached to the housing, and the connector 8 is disposed in the second region $R_L$ in which the electronic component 4*b* is disposed. Since the connector 8 is a member having a heat generating property, it is possible to disperse the heat generation region and increase the heat radiation of the entire electronic control device 100 by disposing the connector 8 in the second region $R_L$ in which the heat generation amount is small.

Second Embodiment

Figure 9:
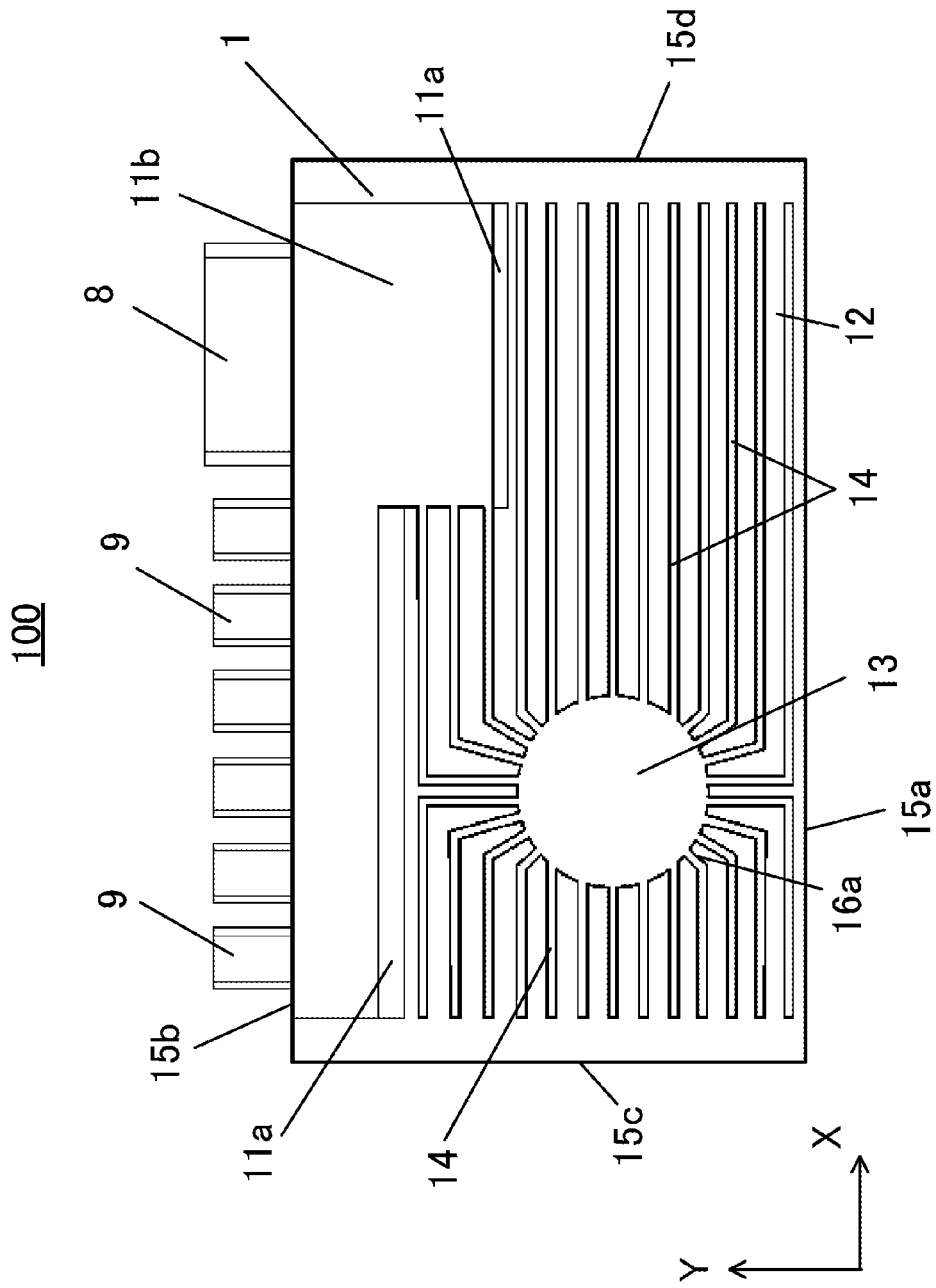
FIG. 9 is a top view of an electronic control device according to a second embodiment of the present invention.

FIG. 9 is a top view of an electronic control device according to a second embodiment of the present invention.

In the electronic control device 100 of the second embodiment, the shape of a thin heat radiation block 13 having a rectangular shape in a plan view in the first embodiment is set to be a circular shape in a plan view, and the electronic control device 100 has a structure of which the overall shape is replaced with a thin cylindrical shape or a thin truncated cone shape.

Each of the plate-shaped heat radiation fins 14 extend from the outer peripheral portion of the heat radiation block 13.

Although not shown, in the second embodiment, the layout of the electronic components 4*a* to 4*d* in the housing is the same as that in the first embodiment, the electronic component 4*a*, which is a high heat generation component, is disposed in the first region $R_H$, the electronic component 4*a* facing the heat radiation block 13, and the electronic component 4*b*, which is a low heat generation component, is disposed in the second region $R_L$ between the heat radiation block 13 and the side portion 15*d* of the case for heat radiation 1.

Similar to the first embodiment, a plurality of heat radiation fins 14 are connected to the peripheral surface of the heat radiation block 13 having a circular shape in a plan view. These heat radiation fins 14 include a first fin group having a linear shape, which extends from the peripheral surface in a +X direction and a −X direction, a second fin group having a bent shape, which is formed of a linear portion extending from the peripheral surface in a +Y direction and a −Y direction and a linear portion bent at an end of the linear portion in the +X direction and the −X direction, and a third fin group having a bent shape, which is formed of a linear portion extending radially from the peripheral surface and a linear portion bent at an end of the linear portion in the +X direction and the −X direction.

The first to third fin groups will be described in detail.

A part of the first fin group, that is, some of the heat radiation fins 14 provided in the center portion of the heat radiation block 13 in the Y direction extend in parallel in the +X direction and are connected to the side portion 15d of the case for heat radiation 1 via the electronic component 4b. The remaining fin group of the first fin group, that is, the heat radiation fins 14 provided in the center portion of the heat radiation block 13 in the Y direction extend in the −X direction and are connected to the side portion 15c of the case for heat radiation 1.

A part of the third fin group, that is, some of the heat radiation fins 14 provided on the +X direction side with respect to the center portion of the heat radiation block 13 in the Y direction extend radially from the outer peripheral portion of the heat radiation block 13, are bent toward the side portion 15d of the case for heat radiation 1 in different positions in the Y direction, extend in parallel in the +X direction, and are connected to the side portion 15d of the case for heat radiation 1 or connected to the front surface portion 11 via the electronic component 4b. The remaining fin group of the third fin group, that is, the heat radiation fins 14 provided in the −X direction with respect to the center portion of the heat radiation block 13 in the Y direction extend radially from the outer peripheral portion of the heat radiation block 13, are bent toward the side portion 15c of the case for heat radiation 1 in different positions in the Y direction, extend in parallel in the −X direction, and are connected to the side portion 15c of the case for heat radiation 1.

A part of the second fin group, that is, some of the heat radiation fins 14 provided on the −Y direction side with respect to the center portion of the heat radiation block 13 in the Y direction extend in parallel in the −Y direction, are bent toward the side portion 15d of the case for heat radiation 1 at an end in the −Y direction and extend in parallel in the +X direction to be connected to the side portion 15d of the case for heat radiation 1 via the electronic component 4b, and some of the heat radiation fins 14 are bent toward the side portion 15c of the case for heat radiation 1 at an end in the −Y direction and extend in parallel in the −X direction to be connected to the side portion 15c of the case for heat radiation 1. The remaining fin group of the second fin group, that is, the heat radiation fins 14 provided on the +Y direction side with respect to the center portion of the heat radiation block 13 in the Y direction extend in parallel in the Y direction, are bent toward the side portion 15c of the case for heat radiation 1 at an end in the Y direction and extend in parallel in the −X direction to be connected to the side portion 15c of the case for heat radiation 1, and the heat radiation fins 14 are bent toward the side portion 15d of the case for heat radiation 1 at an end in the Y direction and extend in parallel in the +X direction to be connected to the front surface portion 11.

The other configurations in the second embodiment are the same as in the first embodiment.

In the second embodiment, the heat radiation block 13 having a large heat capacity is also heat-bonded to the first electronic component 4a. A plurality of plate-shaped heat radiation fins 14 connected to the peripheral side portion of the case for heat radiation 1 are provided in the outer peripheral portion of the heat radiation block 13. The length of the heat radiation fins 14 extending in the longitudinal direction is greater than the length of the heat radiation fins extending in the lateral direction. Some of the heat radiation fins 14 extend toward the electronic component 4b to be connected to the peripheral side portion. That is, some of the heat radiation fins 14 extend onto the second region $R_L$ including the electronic component 4b having a heat generation amount smaller than that of the electronic component 4a.

Therefore, in the second embodiment, the same effects (1) to (3) as in the first embodiment are obtained.

In the second embodiment, the heat radiation block 13 has a cylindrical shape or a truncated cone shape, but a cross-sectional shape of the heat radiation block 13 may have an elliptical shape. The heat radiation block 13 may have a polygonal shape such as a triangular shape or a pentagonal shape.

In each of the above embodiments, the structure has been exemplified as a structure in which the case for heat radiation 1 and the lower case 2 constitute the housing. However, the housing may be configured with three or more cases by interposing an intermediate case between the case for heat radiation 1 and the lower case 2.

In each of the above embodiments, the case for heat radiation 1 has been exemplified as a box-shaped structure in which the peripheral side portion is substantially bent downward. However, the case for heat radiation 1 may be a plate-shaped member that does not have a bent portion. That is, a flat plate-shaped case for heat radiation 1 may be disposed on the top surface of the peripheral wall forming an opening of the lower case 2 to cover a space accommodating the electronic component in the lower case 2.

In each of the above embodiments, the electronic component 4a has been exemplified as a BGA-type semiconductor device. However, the electronic component 4a may be an electronic component other than the BGA-type semiconductor device.

In each of the above embodiments, the electronic components 4a to 4d have been exemplified as a structure in which one circuit board 3 is mounted. However, the electronic components 4a to 4d may be mounted on different circuit boards. For example, the electronic components 4a, 4c, and 4d disposed in the first region $R_H$ and the electronic component 4b disposed in the second region $R_L$ can be mounted on different circuit boards. Further, another circuit board may be accommodated in the housing, and the electronic component 4a, and the electronic components 4c and 4d may be mounted on different circuit boards.

In the present specification, a substrate is used as a term including one circuit board 3 and a plurality of circuit boards 3.

In each of the above embodiments, the heat radiation block 13 has been exemplified as a structure in which the heat radiation block 13 is disposed near the center portion of the case for heat radiation 1, which is separated from the side portions 15a to 15d and the front surface portion 11 of the case for heat radiation 1. However, the heat radiation block 13 may be provided by connecting a part of the rectangular sides 16a to 16d or the circular outer peripheral portion of the heat radiation block 13 to the side portions 15a to 15d or the front surface portion 11 of the case for heat radiation 1. Alternatively, the heat radiation block 13 may be provided at any corner portion of the case for heat radiation 1.

In each of the above embodiments, a structure has been exemplified in which only the electronic component 4a is heat-bonded to the heat radiation block 13. However, a plurality of the heat radiation blocks 13 may be provided so as to be heat-bonded to a plurality of the electronic components having a large heat generation amount. For example, the heat radiation block 13 that is heat-bonded to the electronic component 4c shown in FIG. 4 may be provided.

Although not shown, a via (or through hole) penetrating in the thickness direction of the circuit board 3 may be provided in the region of the circuit board 3 facing the electronic component 4a having a large heat generation amount. By providing the via on the circuit board 3, the heat generated in the electronic component 4a is conducted to the lower case 2 via the via and the lower surface of the circuit board 3, and therefore the heat radiation can be improved. In this case, a resin may be filled between the lower surface of the circuit board 3 and the lower case 2, or the lower case 2 may be provided with the heat radiation block that is heat-bonded to the via. Since the heat conductivity is increased by the resin and the heat radiation block, the heat radiation is further improved.

Various embodiments and modification examples have been described above, but the present invention is not limited thereto. Other aspects conceivable within the scope of the technical idea of the present invention are also included within the scope of the present invention.

The disclosure content of the priority basic application is incorporated herein as a reference.

Japanese Patent Application No. 2018-176227 (filed on Sep. 20, 2018)

REFERENCE SIGNS LIST 1 case for heat radiation
3 circuit board (substrate)
4a electronic component (first electronic component)
4b electronic component (second electronic component)
4c, 4d electronic component (third electronic component)
5 heat conductive material
8 connector (connector for power supply)
11 front surface portion
12 main body portion
13 heat radiation block
13a inner raised portion
13b outer raised portion
14 heat radiation fin
15a, 15b side portion (side portion in longitudinal direction)
15c, 15d side portion (side portion in lateral direction)
16a to 16d side
17 conductive bonding material
100 electronic control device
$R_H$ first region
$R_L$ second region

The invention claimed is:

1. An electronic control device comprising:
a first electronic component having a first heat generation amount;
a second electronic component having a second heat generation amount smaller than the first heat generation amount;
a substrate on which the first and second electronic components are mounted; and
a housing that accommodates the first electronic component, the second electronic component and the substrate, and includes a case for heat radiation having a heat radiation structure through which heat of the first and second electronic components is radiated,
wherein the heat radiation structure includes a heat radiation block that is heat-bonded to the first electronic component, and a plurality of plate-shaped heat radiation fins extending outward from an outer peripheral portion of the heat radiation block, and
wherein at least some of the heat radiation fins extend from the outer peripheral portion of the heat radiation block toward the second electronic component, and are connected to a peripheral side portion of the case for heat radiation.

2. The electronic control device according to claim 1, wherein the first electronic component is bonded to the substrate by a conductive bonding material, and a heat conductive material is interposed between a surface of the first electronic component on a side opposite to the substrate and the heat radiation block.

3. The electronic control device according to claim 1, wherein
the case for heat radiation has a rectangular shape having a pair of longitudinal direction side portions extending in a longitudinal direction and a pair of lateral direction side portions extending in a lateral direction,
wherein the first electronic component and the second electronic component are disposed apart from each other in the longitudinal direction, and
wherein at least some of the plurality of heat radiation fins extend in parallel in the longitudinal direction.

4. The electronic control device according to claim 3, wherein the heat radiation block is disposed in a position closer to one side of the lateral direction side portion than a center portion of the case for heat radiation in the longitudinal direction.

5. The electronic control device according to claim 3, wherein
the heat radiation block has a square or rectangular shape having four sides in a plan view, and
wherein the heat radiation fins are provided in the sides of the heat radiation block.

6. The electronic control device according to claim 3, wherein
the heat radiation block has a circular or elliptical shape in a plan view, and
wherein at least some of the heat radiation fins are provided radially from the outer peripheral portion of the heat radiation block.

7. An electronic control device comprising:
a first electronic component having a first heat generation amount;
a second electronic component having a second heat generation amount smaller than the first heat generation amount;
a substrate on which the first and second electronic components are mounted; and
a housing that accommodates the first electronic component, the second electronic component and the substrate, and includes a case for heat radiation having a heat radiation structure through which heat of the first and second electronic components is radiated;
wherein the heat radiation structure includes a heat radiation block that is heat-bonded to the first electronic component, and a plurality of plate-shaped heat radiation fins extending outward from an outer peripheral portion of the heat radiation block, and
wherein the case for heat radiation includes a main body portion that holds a plurality of the heat radiation fins and the heat radiation block, the plurality of heat radiation fins have a predetermined height with which the heat radiation fins protrude substantially perpendicular to an opposite side of the first electronic component from the main body portion, and the heat radiation block includes an inner raised portion that protrudes to the first electronic component from the main body portion and an outer raised portion having a predetermined height with which the outer raised portion protrudes to the opposite side of the first electronic component from the main body portion.

8. The electronic control device according to claim 7, wherein the inner raised portion of the heat radiation block has an area substantially equal to or larger than an area of a heat radiation surface of the first electronic component in a plan view, and the outer raised portion has a height substantially equal to that of the heat radiation fins.

9. An electronic control device comprising:
a first electronic component having a first heat generation amount;
a second electronic component having a second heat generation amount smaller than the first heat generation amount;
a substrate on which the first and second electronic components are mounted;
a housing that accommodates the first electronic component, the second electronic component and the substrate, and includes a case for heat radiation having a heat radiation structure through which heat of the first and second electronic components is radiated; and
at least one third electronic component having a heat generation amount smaller than that of the second electronic component,
wherein the heat radiation structure includes a heat radiation block that is heat-bonded to the first electronic component, and a plurality of plate-shaped heat radiation fins extending outward from an outer peripheral portion of the heat radiation block,
wherein the first electronic component and the third electronic component are disposed in a first region in which an electronic component having a large heat generation amount is disposed, and the second electronic component is disposed in a second region in which an electronic component having a heat generation amount smaller than that in the first region is disposed, and
wherein some of the heat radiation fins extend from the first region toward the second region, and are connected to a peripheral side portion of the case for heat radiation.

10. The electronic control device according to claim 9, wherein
the housing is provided with a connector for power supply that supplies power to the first electronic component and the second electronic component, and
wherein the connector for power supply is disposed in the second region.

* * * * *